United States Patent
Zerbe et al.

(10) Patent No.: US 9,213,657 B2
(45) Date of Patent: Dec. 15, 2015

(54) MEMORY CONTROLLER WITH FAST REACQUISITION OF READ TIMING TO SUPPORT RANK SWITCHING

(75) Inventors: Jared L. Zerbe, Woodside, CA (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 296 days.

(21) Appl. No.: 13/817,135

(22) PCT Filed: Aug. 4, 2011

(86) PCT No.: PCT/US2011/046516
§ 371 (c)(1),
(2), (4) Date: Feb. 14, 2013

(87) PCT Pub. No.: WO2012/027080
PCT Pub. Date: Mar. 1, 2012

(65) Prior Publication Data
US 2013/0159657 A1    Jun. 20, 2013

Related U.S. Application Data

(60) Provisional application No. 61/377,013, filed on Aug. 25, 2010.

(51) Int. Cl.
*G11C 7/22* (2006.01)
*G06F 13/16* (2006.01)
*G11C 8/18* (2006.01)

(52) U.S. Cl.
CPC .............. *G06F 13/1689* (2013.01); *G11C 8/18* (2013.01); *G06F 2213/0038* (2013.01); *G11C 7/22* (2013.01)

(58) Field of Classification Search
CPC ..................... G06F 13/1689; G06F 1/04–1/12; G11C 7/22–7/227

USPC .......................................................... 711/167
See application file for complete search history.

(56) References Cited

U.S. PATENT DOCUMENTS 7,199,624 B2    4/2007  Wong et al.
7,336,111 B2    2/2008  Lin et al.
(Continued)

FOREIGN PATENT DOCUMENTS

KR    10-2006-0035989 A    4/2006
WO    WO2010/080173    *  7/2010    ................ G06F 1/04

OTHER PUBLICATIONS

PCT International Search Report and Written Opinion, PCT/US2011/046516, Jan. 2, 2012, 8 Pages.
(Continued)

*Primary Examiner* — Aimee Li
*Assistant Examiner* — Nicholas Simonetti
(74) *Attorney, Agent, or Firm* — Fenwick & West LLP (57) ABSTRACT

Techniques for performing fast timing reacquisition of read timing in a memory controller to support rank switching device are described. During operation, a memory controller receives read data for a read operation, wherein the read data includes a calibration preamble. The memory controller uses the calibration preamble to perform a fast timing reacquisition operation to compensate for a timing drift between a clock path and a data path for the read data. In particular, the memory controller performs the fast timing reacquisition by adjusting a data delay line coupled to a clock path associated with a control loop, wherein the control loop controls a data clock which is used to receive read data at the memory controller.

22 Claims, 10 Drawing Sheets

(56) References Cited

U.S. PATENT DOCUMENTS

| | | |
|---|---|---|
| 7,558,979 B2 | 7/2009 | Song et al. |
| 7,685,393 B2 | 3/2010 | Gillingham et al. |
| 7,903,499 B2 | 3/2011 | Kim et al. |
| 2006/0092717 A1 | 5/2006 | Song et al. |
| 2007/0195637 A1 | 8/2007 | Lin |
| 2008/0005518 A1* | 1/2008 | Gillingham et al. ......... 711/167 |
| 2009/0031091 A1* | 1/2009 | Chang et al. ................. 711/154 |
| 2009/0154256 A1 | 6/2009 | Kim et al. |
| 2009/0271652 A1 | 10/2009 | Song et al. |
| 2010/0157700 A1* | 6/2010 | Kong et al. ................... 365/194 |
| 2010/0220536 A1* | 9/2010 | Coteus et al. ................. 365/193 |
| 2011/0016282 A1 | 1/2011 | Gillingham et al. |
| 2011/0299347 A1* | 12/2011 | Swanson et al. ............. 365/193 |

OTHER PUBLICATIONS

Lee et al., "A Low-Noise Fast-Lock Phase-Locked Loop with Adaptive Bandwidth Control," IEEE journal of Solid-State circuits, vol. 35, No. 8, Aug. 2000. 9 pages.

\* cited by examiner

MEMORY CONTROLLER WITH FAST REACQUISITION OF READ TIMING TO SUPPORT RANK SWITCHING

TECHNICAL FIELD

The disclosed embodiments generally relate to the design of memory systems for computers. More specifically, the disclosed embodiments relate to a controller and memory device that support fast acquisition of read timing to facilitate efficient rank switching during read operations.

RELATED ART

In enterprise computing systems, such as servers that contain numerous ranks of memory, idle power is becoming a significant issue. At any given time, only one rank is actively accessed, while all of the other ranks remain idle but still continue to draw power, which enables these other ranks to be rapidly put into service. In servers that have a large number of memory ranks, this idle power can easily exceed active power. In such systems, this idle power can be significantly reduced by moving timing-control components, such as phase-locked loops (PLL) or delay-locked loops (DLL), from the memory ranks to the memory controller. In such designs, timing information can be provided to the memory controller from individual ranks to make timing updates in order to compensate for noise and timing drift of the individual ranks.

In existing memory systems, when accessing a given rank, no timing information is available for other ranks. During this time, supply voltage and temperature may drift, which can cause the timing for the circuitry in the other ranks to change. Moreover, high-frequency power supply noise can also shift the timing of the ranks. Hence, if a rank has not been accessed for a significant period of time, it may be necessary to first perform a timing update for the rank before the rank can be accessed.

Note that memory systems typically include some type of feedback-control loop, such as a phase-locked loop (PLL) or a delay-locked loop (DLL), to dynamically update timing signals for memory accesses. Unfortunately, the timing updates produced by such feedback-control loops typically require many clock cycles, and are hence either consume too much power (if idle ranks are left on), or are too slow (if idle ranks are transitioned from off to on) to compensate for timing drift for an idle rank during a rank-switching operation.

Hence, what is needed is a technique for compensating for such timing drift in a power efficient manner without the performance issues associated with using these slow feedback-control loops.

DETAILED DESCRIPTION

The following description is presented to enable any person skilled in the art to make and use the invention, and is provided in the context of a particular exemplary application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The following description presents various exemplary methods and apparatus for performing a fast timing reacquisition for read timing in a memory controller during a read operation to support rank switching between multiple-ranks of memory devices. In some embodiments, a memory controller receives read data for a read operation, wherein the read data includes a calibration preamble. While receiving the calibration preamble, the memory controller uses the calibration preamble to perform a fast timing reacquisition to compensate for any timing drift that has occurred between a clock path and a data path for the read data while the rank was not being accessed. In particular, the memory controller performs the fast timing reacquisition by adjusting a delay line coupled to a clock path associated with a control loop, wherein the control loop controls a data clock which is used to receive read data at the memory controller.

In other embodiments, instead of receiving a calibration preamble which is prepended to the read data, the memory controller receives a calibration signal prior to receiving the read data, wherein the calibration signal is transmitted on a different signal line than the read data (and is subsequently received on a different pin from the read data). Hence, whenever the term "calibration preamble" is used in this disclosure, the term is also meant to refer to a calibration signal which precedes the read data and is transmitted in a separate signal line from the read data.

Figure 1A:
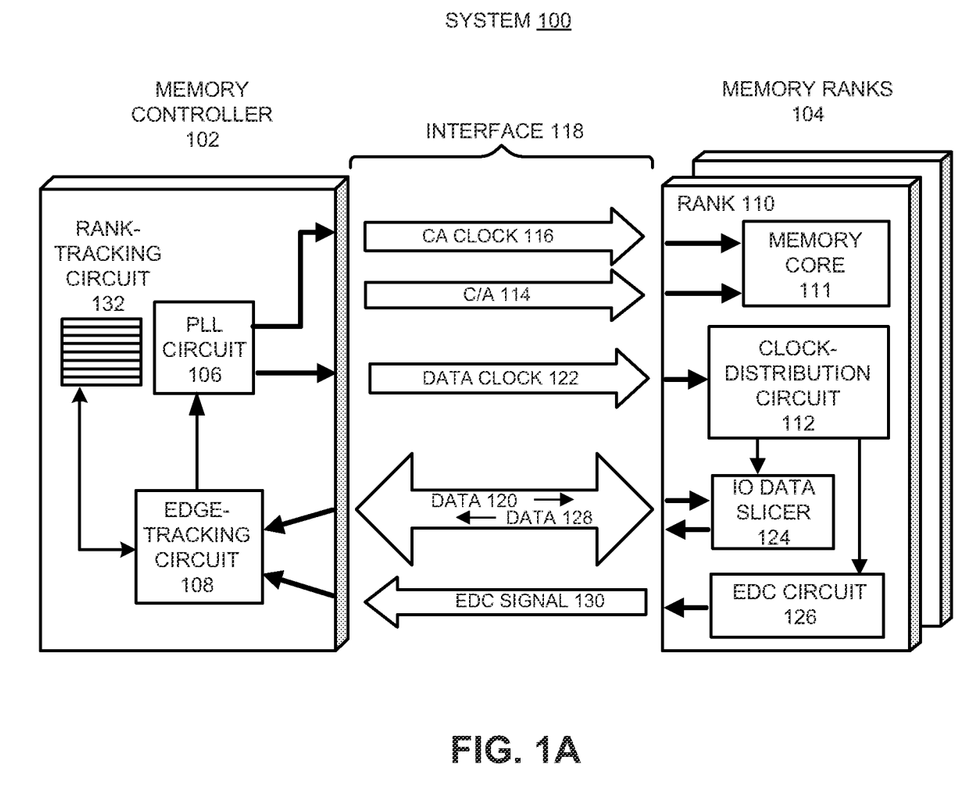
FIG. 1A presents a block diagram illustrating a memory system which performs timing updates between a memory controller and a set of memory ranks.

FIG. 1A presents a block diagram illustrating a system 100 which performs timing updates between a memory controller 102 and a set of memory ranks (such as DRAM ranks) 104, wherein the set of memory ranks can be incorporated into one or more memory devices, and wherein each memory device includes a memory core containing a plurality of memory elements. Memory controller 102 includes a PLL/DLL circuit 106 and an edge-tracking circuit 108. (Note that PLL/ DLL circuit 106 can generally include any circuit that facilitates phase/frequency acquisition, such as a PLL, a DLL or other phase acquisition loop.) Memory ranks 104 include two or more ranks, such as a rank 110, wherein each rank further includes a memory core 111 and a clock-distribution circuit 112. Note that there are no PLLs or DLLs in the memory ranks 104 in the embodiment shown in FIG. 1A.

During a memory access to an active rank 110, memory controller 102 transmits command/address (C/A) 114 and the command/address (CA) clock 116 to rank 110 over a chip-to-chip interface 118. Memory controller 102 can also transmit data 120 and data clock 122 to rank 110 over chip-to-chip interface 118. In some embodiments, data clock 122 is a full-bit-rate differential data clock (DCLK) for the data interface on rank 110, which provides a clock edge per bit, whereas CA clock 116 is a differential clock operating at one-quarter the rate of data clock 122, which is used for timing on the CA interface and for memory core 111. Note that the CA I/Os on rank 110 are directly clocked by CA clock 116, while write data 120 is directly clocked on rank 110 by data clock 122. Also note that some additional amplification and buffering may be required in each case to distribute the clocks across their respective data receivers.

Memory rank 110 receives data 120 and data clock 122, and distributes data clock 122 through clock-distribution circuit 112 to both an I/O data slicer 124 and an error detection and correction (EDC) circuit 126. I/O data slicer 124 transmits memory-device-sampled data 128, and EDC circuit 126 transmits an EDC signal 130 back to memory controller 102. Note that both data 128 and EDC signal 130 contain clock-to-data relative phase information regarding the memory transactions taking place on rank 110. In some embodiments, EDC signal 130 contains CRC codes, which are scrambled or interspersed with a toggling idle pattern to achieve a minimum edge density.

Data 128 and EDC signal 130 are received by memory controller 102. Note that edge-tracking circuit 108 on memory controller 102 receives both memory-device-sampled versions of data 128 and EDC signal 130, and can subsequently use information in the data and EDC to infer the validity of the timing information that propagates in the "write direction" from the controller to the memory. This phase information is then sent to PLL circuit 106, which uses the phase information to perform phase updates for data clock 122 to compensate for timing drift and timing jitter for rank 110. PLL circuit 106 also updates CA clock 116 based on the same phase information from edge-tracking circuit 108.

To facilitate fast switching between ranks, unique clock or data phase information for each individual rank can be stored at the memory controller. For example, in the embodiment illustrated in FIG. 1A, memory controller 102 includes a rank-tracking circuit 132 coupled to edge-tracking circuit 108, which stores and updates phase information for each of the memory ranks 104. Hence, the phase information for a new rank to be accessed is first loaded into a phase mixer after a rank switch occurs. Concurrently, the most recently updated phase information for a previously accessed rank is then stored into rank-tracking circuit 132 at that rank's address.

When a new rank is accessed after an idle period for that rank, data and an EDC signal eventually become available for the new rank. It is possible to use the EDC signal to perform timing updates for the new rank using the above-described timing update loop in FIG. 1A. However, this timing update loop involves feedback inside a low-bandwidth loop and a long path delay which may not be sufficiently fast to track high-frequency timing jitter, such as power supply induced jitter (PSIJ), and may not achieve phase lock fast enough to provide acceptably low latency when accessing the new rank. Moreover, the EDC signal only captures timing errors for preceding transactions, and therefore trails behind the data used to produce the EDC signal. Further, during read transactions, the memory controller only receives the EDC signal after read data has already been received without associated clock phase updates.

Some of the presently described techniques provide rapid phase updates of read timing for a rank which is being accessed for the first time after an idle period. This is accomplished by initially transmitting a calibration preamble from the rank to the memory controller before the first real read data packet and the corresponding EDC packet are transmitted. In some embodiments, the calibration preamble may be prepended to the head of the first available read data burst being transmitted from a newly accessed rank to the memory controller. Upon receiving the calibration preamble, the memory controller may perform fast phase acquisition during the calibration preamble to correct a substantial portion of any accumulated timing error for the rank. In some embodiments, this calibration preamble comprises a toggling pattern which provides a predetermined number of timing edges with the maximum transition density. In some other embodiments a scrambled pattern can be used.

Figure 1B:
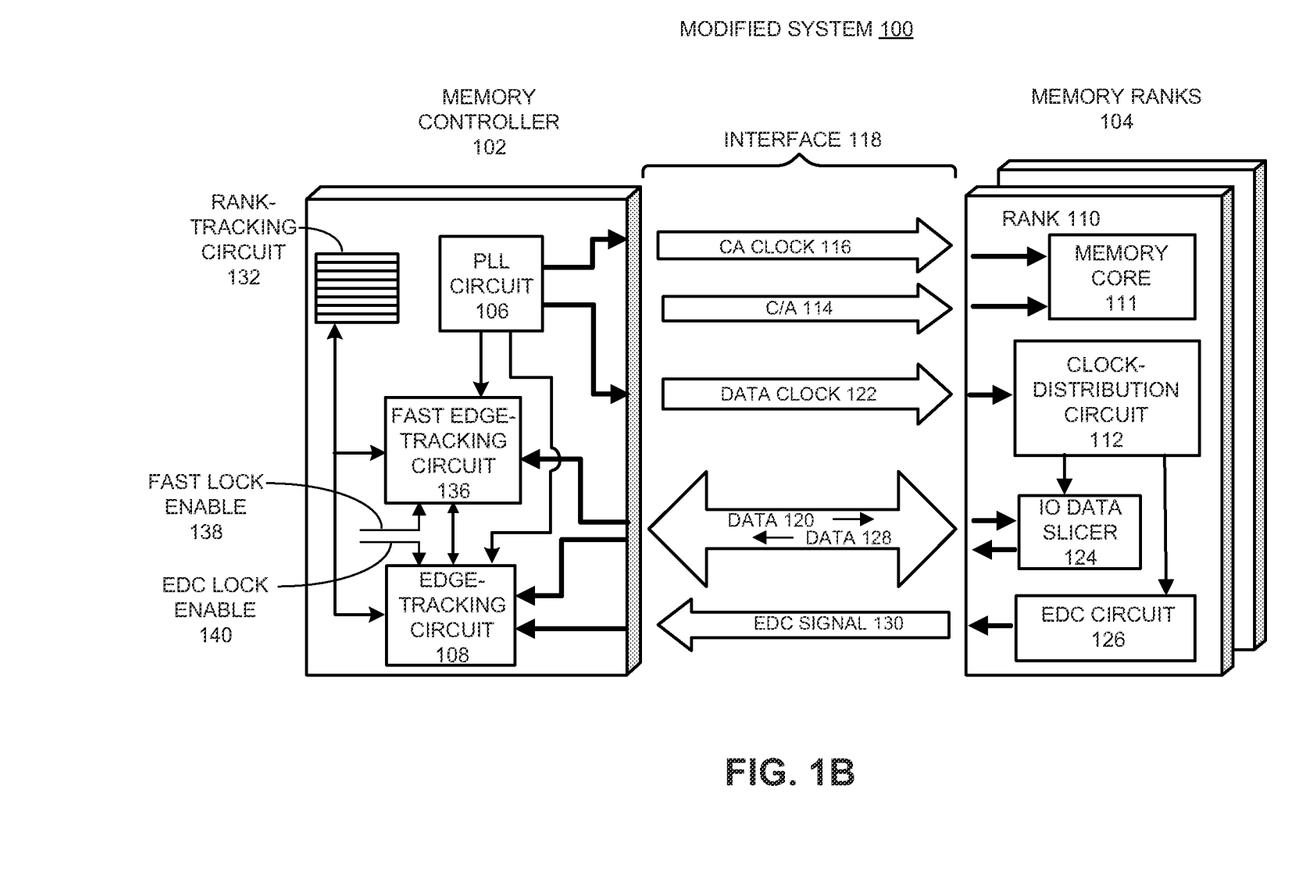
FIG. 1B presents a block diagram illustrating a modified memory system which performs fast timing updates between a memory controller and a set of memory ranks.

FIG. 1B presents a block diagram illustrating a modified system 100 which performs fast timing updates between a memory controller 102 and a set of memory ranks 104. As illustrated in FIG. 1B, a fast edge-tracking circuit 136 is added to memory controller 102's clock architecture to provide fast phase updates within a received calibration preamble. For example, assume fast edge-tracking circuit 136 receives a sampled version of data 128 from the new rank being accessed. If data 128 contains a calibration preamble, fast edge-tracking circuit 136 uses the toggling pattern in the calibration preamble to make fast phase updates to a read data clock used to capture the actual read data in data 128 following the calibration preamble. In this embodiment, after the initial updates based on the calibration preamble have been made, edge-tracking circuit 108 performs subsequent lower-bandwidth continuous phase updates to the read data clock during data transactions following the calibration preamble in a normal fashion. In some embodiments, fast edge-tracking circuit 136 operates at a significantly faster speed than edge-tracking circuit 108, which allows the phase update to complete within the preamble duration, before the actual read data arrives at the memory controller. Furthermore, to ensure their independent operation without interfering with each other, fast edge-tracking circuit 136 and edge-tracking circuit 108 can be gated by different timing signals, namely fast lock enable 138 and EDC lock enable 140 in FIG. 1B.

Note that the additional phase adjustment capabilities provided by fast edge-tracking circuit 136 in the clock architecture of memory controller 102 facilitate additional power supply induced jitter/buffer-skew tracking and can relax the design requirements for power supply immunity of the clock-distribution circuit 112 on memory ranks 104. Moreover, to improve resolution and increase acquisition speed, fast edge-tracking circuit 136 can also provide a shorter adjustment range to accommodate only the timing drift expected from the idle period between accesses to a given rank. Note that this amount of drift can be bounded by specifying a maximum allowable idle period between accesses to, and thus phase-updates from a given rank. In one embodiment, the memory controller can detect ranks that have not been accessed for a long period of time. To prevent a large timing drift, which may be difficult to correct using a reasonable length preamble, the controller can periodically access a rank if the rank has been idle for longer than a predetermined maximum time.

Figure 2:
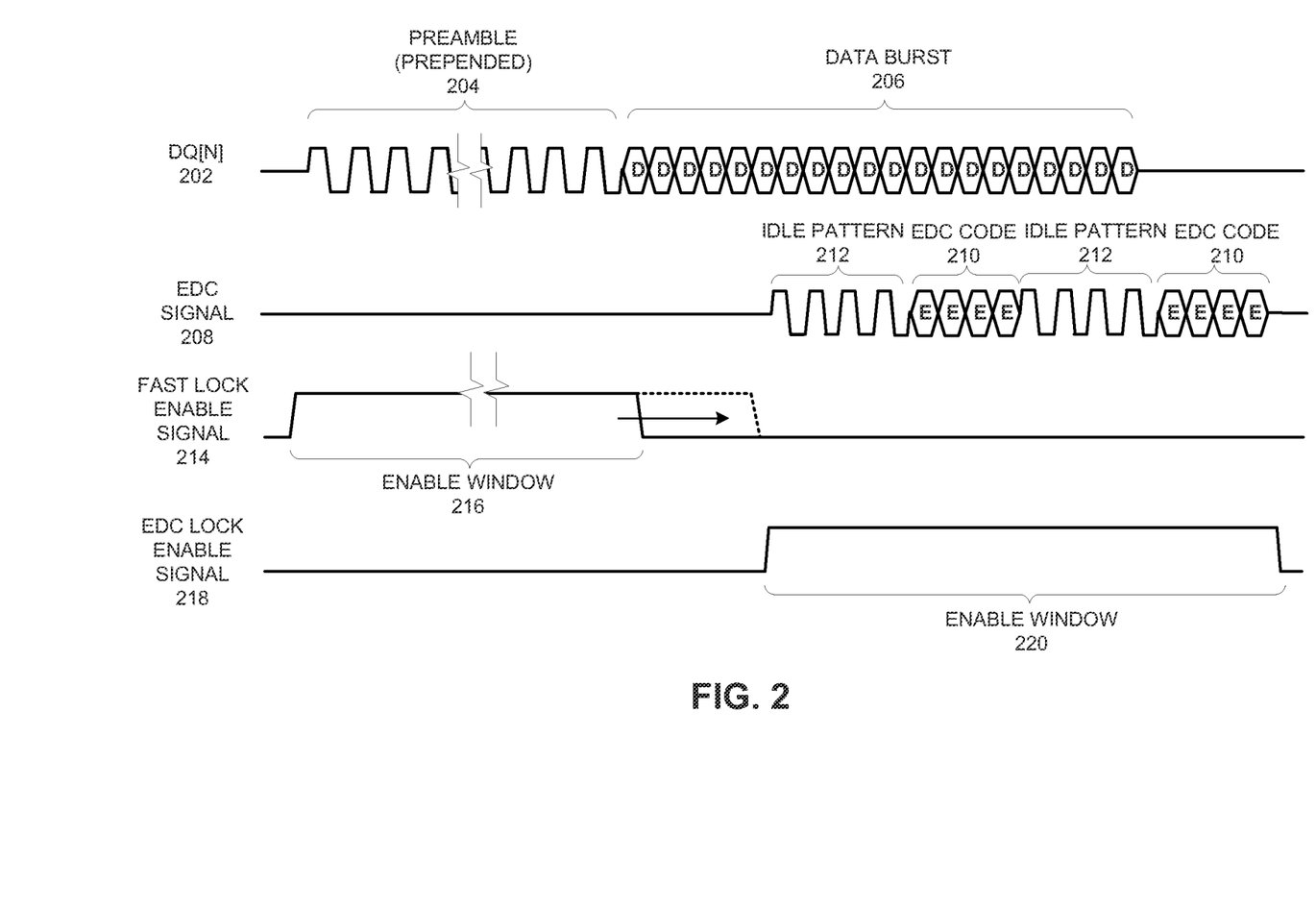
FIG. 2 presents a simplified timing diagram illustrating preamble-based fast timing updates between a memory controller and a memory rank.

FIG. 2 presents a simplified timing diagram illustrating preamble-based fast timing updates between a memory controller and a rank. As illustrated in FIG. 2, a data signal DQ[n] 202 illustrates the beginning of a data pattern received at a memory controller from a new rank [n] which is being accessed after an idle period. DQ[n] 202 begins with a calibration preamble 204 comprising a toggling pattern which contains a predetermined number of edges. Preamble 204 is prepended to a data burst 206 which has a burst length determined by a specific DRAM architecture, for example, 32 bits or 64 bits. When the first memory access to rank [n] after the idle period is a read command, data burst 206 comprises read data returned from rank [n] in response to the read command. Moreover, an EDC signal 208 associated with data burst 206 is also received by the memory controller from the same rank. EDC signal 208 contains an EDC code 210 interspersed with toggling idle patterns 212 to achieve a minimum edge density in EDC signal 208. EDC code 210 can include any type of EDC code, such as a CRC code. Moreover, note that EDC signal 208 trails both preamble 204 and data burst 206.

Upon receiving DQ[n] 202, the memory controller uses preamble 204 to perform a fast phase update without using a time-consuming feedback mechanism. A fast lock enable signal 214, which has an enable window 216 that is substantially time-aligned with preamble 204, is used to gate the phase updates at a fast clock rate. After completing the fast phase updates, normal phase updates can be performed based on EDC signal 208. More specifically, an EDC lock enable signal 218, which has an enable window 220 that is substantially time-aligned with EDC code 210, is used to gate the normal phase updates at a normal slow clock rate which may involve a feedback loop. In some embodiments, however, the enable window 216 of fast lock enable signal 214 may be extended (as shown by the dotted line) to the beginning of enable window 220 in EDC lock enable signal 218. In this embodiment, the initial phase updates (before the EDC-based update) include not only the fast-lock adjustments from preamble 204, but also some phase adjustments based on the first portion of data burst 206.

Generally, the calibration preamble should provide enough edges to perform the required timing updates to compensate from any expected accumulated phase error since the previous rank access before the read data is captured. The length of the calibration preamble may be programmed to accommodate a given memory controller architecture or environmental conditions or system configuration and can be stored in a mode register on that memory controller. For example, some reasonable lengths can include 4, 8, 16, and 32 cycles.

Figure 3:
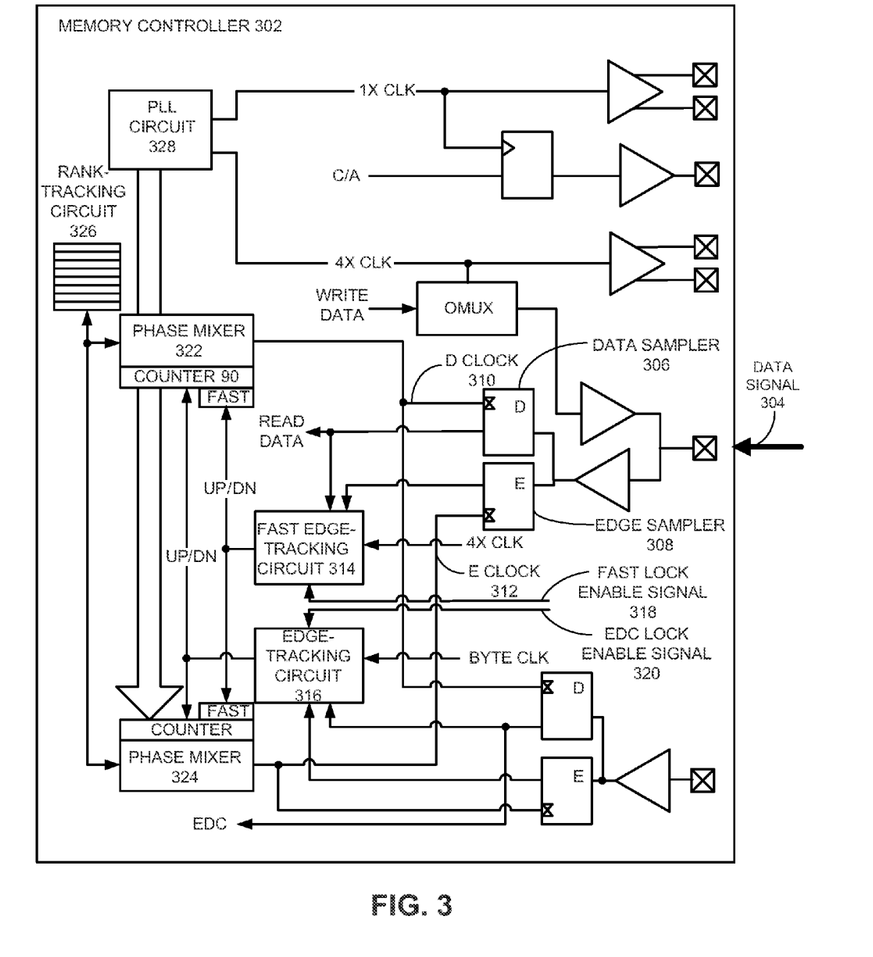
FIG. 3 presents a block diagram illustrating a memory controller which is a more detailed implementation of the memory controller illustrated in FIG. 1B.

FIG. 3 presents a block diagram illustrating a memory controller 302 which is a more detailed implementation of memory controller 102 which was illustrated in FIG. 1B. As illustrated in FIG. 3, memory controller 302 receives data signal 304 from an active rank (not shown), wherein data signal 304 begins with a calibration preamble which is followed by actual read data. Data signal 304 is subsequently sampled by both a data sampler 306 and an edge sampler 308, wherein the two sampling clocks ("D" clock 310 for data sampler 306 and "E" clock 312 for edge sampler 308) are configured in some embodiments with a fixed 90° phase offset. Hence, if E clock 312 is aligned with a data transition of data signal 304, D clock 310 is positioned approximately in the center of a corresponding data eye as in a conventional 2× oversampled CDR system.

The sampled outputs of data sampler 306 and edge sampler 308, which contain the sampled values of the calibration preamble, are then received by a fast edge-tracking circuit 314, which is equivalent in functionality to fast edge-tracking circuit 136 in FIG. 1B. Moreover, a regular edge-tracking circuit 316 is equivalent to edge-tracking circuit 108 in FIG. 1B. In some embodiments, fast edge-tracking circuit 314 operates at a significantly faster clock rate than regular edge-tracking circuit 316, which allows the phase update to complete within the calibration preamble duration, before the actual read data arrives at the memory controller. Furthermore, to ensure their independent operation without interfering with each other, fast edge-tracking circuit 314 and regular edge-tracking circuit 316 can be gated using different timing signals, namely fast lock enable signal 318 and EDC lock enable signal 320 as is illustrated in FIG. 3.

Memory controller 302 also includes phase mixers 322 and 324, which generate D clock 310 and E clock 312 for capturing data on data sampler 306 and edge sampler 308, respectively. Note that each of the two phase mixers can receive multiple inputs. For example, phase mixers 322 and 324 receive inputs from a rank-tracking circuit 326, which uses registers to store phase placement information for each of the memory ranks. Hence, after a rank switch occurs, phase placement information for the new rank is first loaded into the phase mixers. At the same time, the most recently updated phase information for a previously accessed rank is stored into rank-tracking circuit 326. Note that rank-tracking circuit 326 is substantially equivalent in function to rank-tracking circuit 132 in FIG. 1B.

Phase mixers 322 and 324 also receive inputs from fast edge-tracking circuit 314, which contain phase error information based on the calibration preamble in data signal 304. More specifically, this phase error information includes both phase relationships between edges in the calibration preamble and the edges in the two sampling clocks. This information facilitates determining and compensating for the timing drift between the read data and the corresponding read clock.

Phase mixers 322 and 324 use the phase error information from edge-tracking circuit 314 to quickly adjust the inputs from rank-tracking circuit 326, and to subsequently generate an updated D clock 310 for data sampler 306 and an updated E clock 312 for edge sampler 308. Because D clock 310 and E clock 312 are locked with a fixed phase offset (in some embodiments 90°), they are adjusted in lock-step. Consequently, it is possible to only perform fast phase updates on one of the two sampling clocks, for example E clock 312, and to generate the other sampling clock, for example D clock 310, by adding a 90° degree phase offset to the first sampling clock. In some embodiments, phase mixers 322 and 324 include special fast counters having larger step sizes and faster logic to perform the fast timing updates based on the calibration preamble at a different step size and/or speed than during normal operation. Note that the above-described fast phase updates based on the calibration preamble are performed in a phase update loop comprising data sampler 306, edge sampler 308, fast edge-tracking circuit 314, phase mixer 322, and phase mixer 324.

Note that phase mixers 322 and 324 also receive phase error information from regular edge-tracking circuit 316, and receive phase placement information from a PLL/DLL circuit 328, which is the equivalent of PLL/DLL circuit 106 in FIG. 1B. Because the phase error information from regular edge-tracking circuit 316 and the phase placement information from PLL/DLL circuit 328 are generated in a relatively slow feedback loop, they are not used during the fast phase update operation which takes place during the calibration preamble. Although the fast phase update architecture illustrated in FIG.

3 performs well when the calibration preamble includes a sufficient number of edges, this architecture may not be fast enough to obtain a fast lock when the length of the calibration preamble is relatively short, for example, only 16 edges long.

Figure 4:
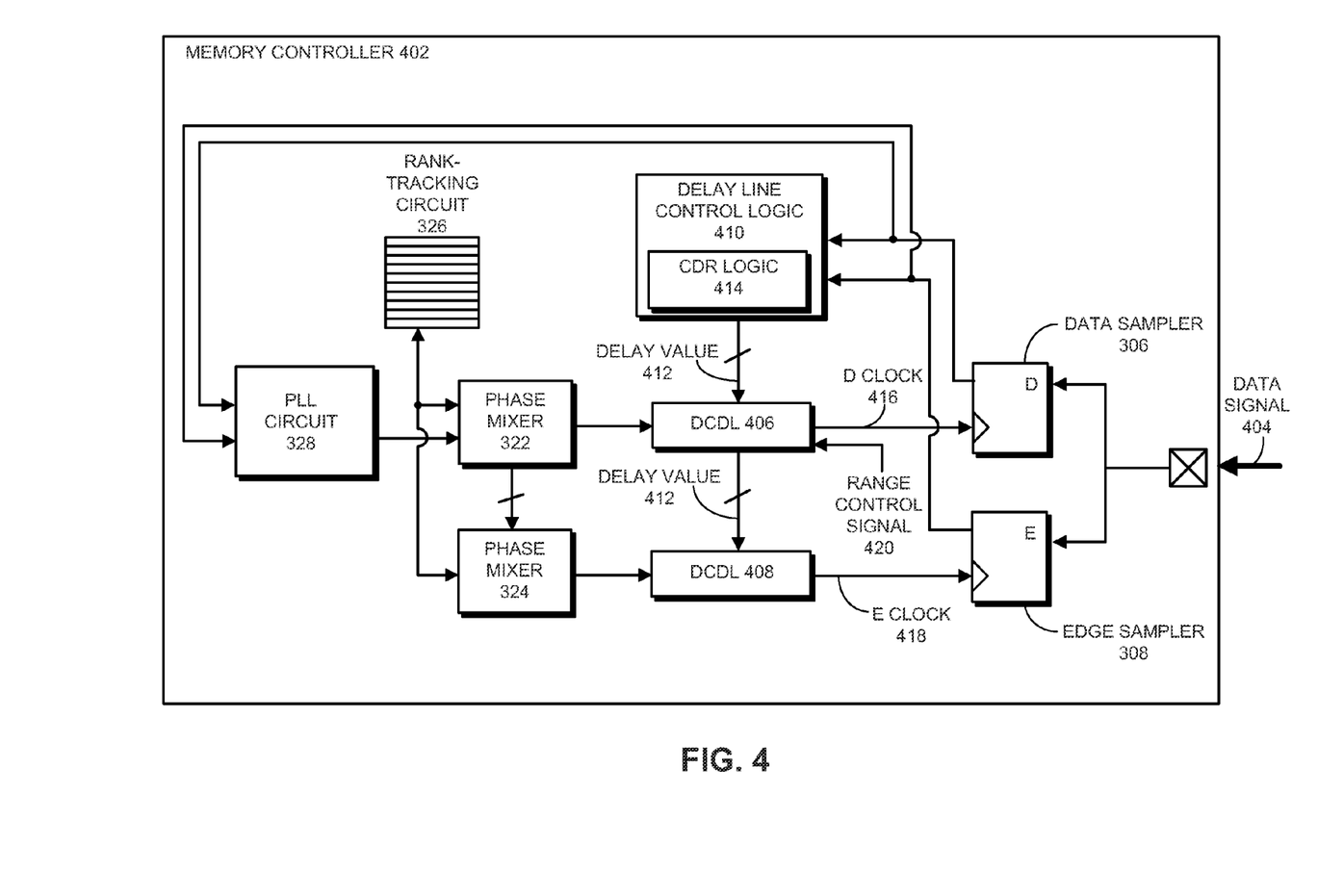
FIG. 4 presents a block diagram illustrating a memory controller which uses a digitally controlled delay line (DCDL) to perform fast updates based on the calibration preamble.

One embodiment divides the phase update loop in FIG. 3 into two different loops. More specifically, FIG. 4 presents a block diagram illustrating a memory controller 402 which uses a digitally controlled delay line (DCDL) in a fast loop to perform fast updates based on the calibration preamble, while a slower feedback control loop which includes PLL circuit 328 performs slower phase updates. Note that memory controller 402 has a substantially similar architecture to memory controller 302, which includes: data sampler 306 and edge sampler 308 for sampling input data signal 404 received from an active memory rank; phase mixers 322 and 324 for updating sampling clocks for the two samplers; rank-tracking circuit 326 for storing phase placement information for each of the memory ranks; and PLL circuit 328 for performing low bandwidth phase calibration and to provide sampling clock signals. Note that many of the components common to memory controller 302 and memory controller 402, such as the transmitting and receiving buffers and EDC signal-tracking circuits, are not shown in FIG. 4.

Unlike memory controller 302 illustrated in FIG. 3, memory controller 402 includes a delay element, DCDL 406 which is inserted between phase mixer 322 and data sampler 306, and another delay element, DCDL 408, which is inserted between phase mixer 324 and edge sampler 308. Moreover, memory controller 402 also includes delay line control logic 410 which is coupled between DCDL 406 and data sampler 306, and also between DCDL 408 and edge sampler 308. Delay line control logic 410 receives sampled values of data signal 404 from the data and edge samplers 306 and 308 and generates and updates a digital delay value 412 based on the previous digital delay value and the sampled data and edge sampler values. In some embodiments, delay line control logic 410 uses CDR logic 414 to extract early-late phase decisions from the sampled values. CDR logic 414 then generates a new digital delay value 412 based on the previous digital delay value and the early-late phase decisions. Next, delay value 412 is used to adjust the delay settings in DCDL 406 and DCDL 408. Note that one or both of DCDLs 406 and 408 can be implemented as a binary-weighted DCDL.

After a rank switching, phase mixers 322 and 324 combine stored phase offsets from rank-tracking circuit 326 and a clock output from PLL circuit 328 to produce initial sampling clocks. Next, the initial sampling clocks are phase-adjusted by performing a fast update operation using DCDL 406 and DCDL 408, which subsequently generate updated D clock 416 for data sampler 306 and updated E clock 418 for edge sampler 308. In some embodiments, D clock 416 and E clock 418 are locked with a fixed 90° phase offset, and they are adjusted in lock-step.

Note that data sampler 306 and edge sampler 308, delay line control logic 410, and DCDL 406 and DCDL 408 comprise a fast update loop. This fast update loop uses the calibration preamble to determine delay settings for DCDL 406 and DCDL 408 to compensate for any timing drift in data signal 404 since the last time the rank was accessed. In some embodiments, DCDL 406 also receives a range control signal 420 which controls a delay range of DCDL 406 based on an estimate of the maximum timing error expected to be compensated for during fast lock of data signal 404. A more detailed description of range control signal 420 is provided below in conjunction with FIG. 5A.

Compared to the phase update loop in memory controller 302, the fast update loop in memory controller 402 bypasses phase mixers 322 and 324, and replaces them with simple delay elements of DCDL 406 and DCDL 408, thereby allowing even faster updates to be performed based on shorter calibration preambles. Note that the entire fast update loop in memory controller 402 is also contained within the low-bandwidth phase update loop including data sampler 306, edge sampler 308, PLL circuit 328, phase mixer 322, and phase mixer 324. A more detailed explanation of the low-bandwidth phase update loop is provided below in conjunction with FIGS. 5A and 5B.

Figure 5A:
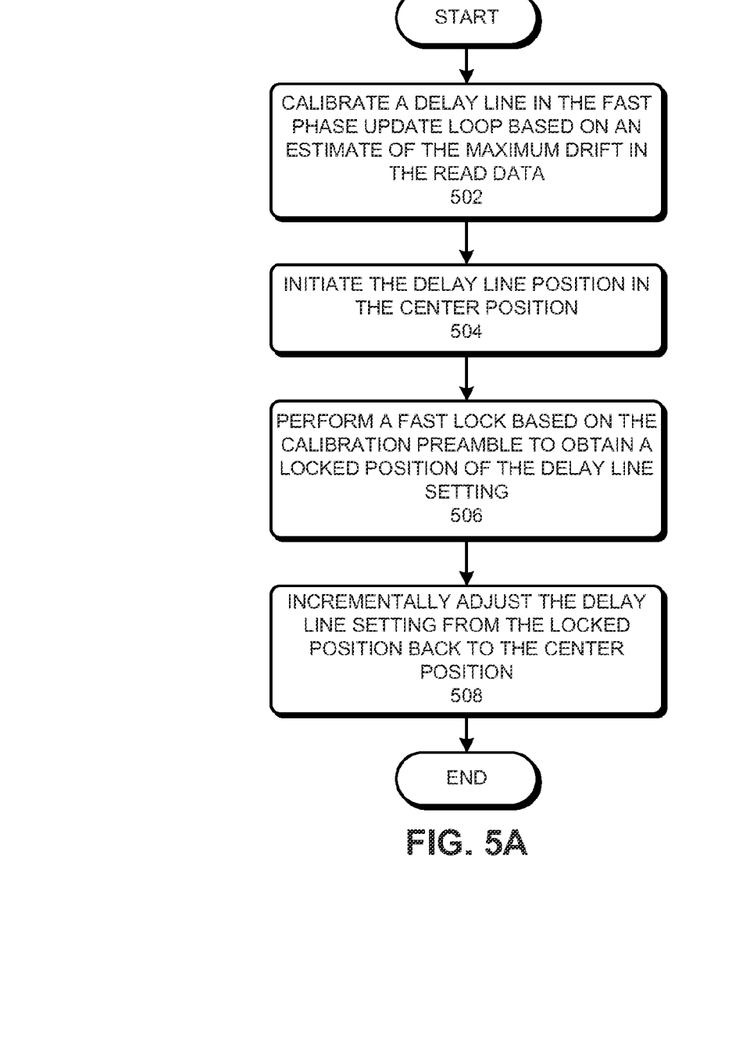
FIG. 5A presents a flowchart illustrating a process for performing a fast timing reacquisition (also referred to as a "fast lock") in a memory controller during a read operation.
Figure 5B:
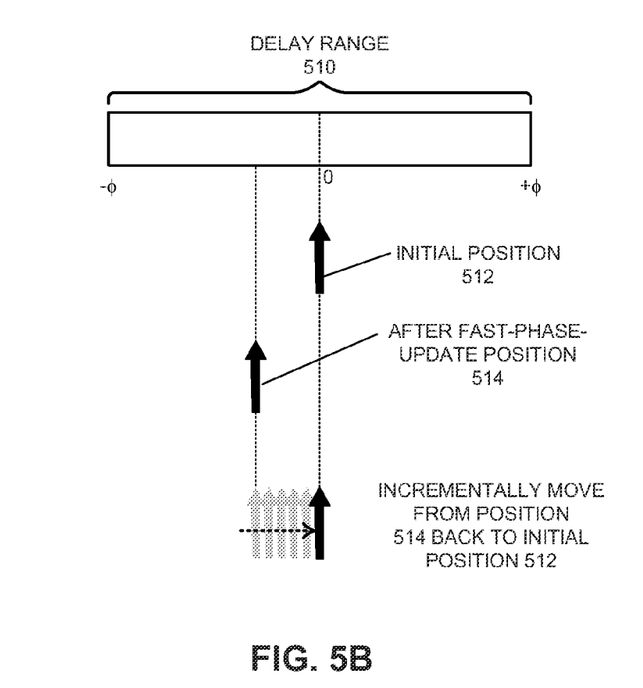
FIG. 5B illustrates the process of scaling the delay line so that the range of delay matches the range of a possible drift.

FIG. 5A presents a flowchart illustrating a process for performing a fast timing reacquisition (also referred to as a "fast phase lock") in memory controller 402 during a read operation. During operation, the system starts by adjusting the range of a delay line in the fast update loop, such as DCDL 406, based on an estimate of the maximum drift in the read data (step 502). In one embodiment, the estimate of the maximum drift is obtained based on empirical drift measurements. Because the drift is often accumulated over time, the longer the idle period is between accesses to a given rank, the larger the drift that is likely to accumulate on that rank. Hence, the amount of drift may be bounded by limiting a maximum allowable idle period for a given rank. Alternately, the range of the delay line in the fast update loop may be adjusted based on the length of the idle period. In an exemplary system, when the idle period is limited to 200 ns, the maximum drift may be bounded between +0.3 UI and −0.3 UI. When the estimate of the maximum drift is obtained, the system can scale the delay line to match the range of the drift. For example, FIG. 5B illustrates scaling the delay line so that the range of delay matches the range of a possible drift. As shown in FIG. 5B, delay range 510 of the delay line is scaled to [−φ, +φ], wherein −φ and +φ correspond to the maximum drift in positive and negative directions, respectively. Note that the center position of delay range 510 is set to zero, which means half of the total delay range of the line is used. Defining '0' to be the center of the delay line allows for both positive and negative adjustments of phase. Such adjustment of the delay line range as is shown in 502 can either: occur only once; be configuration dependent, be calibrated on each power-up; or be done continuously, or in a number of different ways.

After calibrating the delay line, the system initiates the delay line position in the center position (step 504). As illustrated in FIG. 5B, the initial position 512 of the delay line is set to the zero delay position in the center of delay range 510.

Next, the system performs a fast lock operation based on the received calibration preamble to obtain a locked position of the delay line setting (step 506). More specifically, the fast lock operation involves adjusting the delay line setting to compensate for the timing drift in the received data signal with respect to the data clock. As the delay line has been initially zeroed to its center position, timing error can be removed in either positive or negative directions. Moreover, performing the fast lock operation can involve performing any number of search methods, including one of the following operations on the calibration preamble to determine the delay line setting: a binary search; a parallel search; or a linear search. Note that the fast lock operation may be performed using the fast update loop described in FIG. 4. (Detailed embodiments of the fast phase lock operation based on the calibration preamble are provided below in conjunction with FIG. 6.) As illustrated in FIG. 5B, when a lock based on the calibration preamble is acquired, the delay line is programmed to an "after fast-lock" position 514, and the difference between the initial position 512 and the after fast-lock position 514 is substantially equal to the timing drift acquired in the received read data between the recent acquisition and the previous access.

After phase lock is acquired, the system next incrementally adjusts the delay line setting from the locked position back to the center position (step 508) at a greatly reduced rate. Note that step 508 may take place while the actual read data following the calibration preamble is being captured. This movement back to center in 508 is accommodated using the above-described low-bandwidth phase update loop including the PLL and the DCDLs which are included within the PLL loop. More specifically, in each step as the delay line setting retreats back toward the center position, the low-bandwidth phase update loop tracks the delay adjustment (and updates the corresponding register value in rank-tracking circuit 326) as within the normal loop operation. Note that step 508 typically takes significantly longer to complete than the duration of the fast phase lock operation. As the end of step 508, the delay line settings have returned to zero while the corresponding phase value for the timing loop has been updated by means of the phase mixers and updates to compensate for the 'retreat' of the DCDL to fully account for the timing drift in the received read signal. This "slow retreat" operation is also illustrated in FIG. 5B. Note that the combined structure of the fast update loop and the low-bandwidth PLL loop in FIG. 4 allows for seamless updating for the timing drift in a rank, reduces the total hardware required for the fast-locking operation, and reduces the critical path delay. In some embodiments the PLL/DLL circuit 328 can incorporate phase mixers 322/324 inside the PLL/DLL as a method of adjusting phase thereby simplifying the total number of phase-control elements in the clock path.

Figure 6:
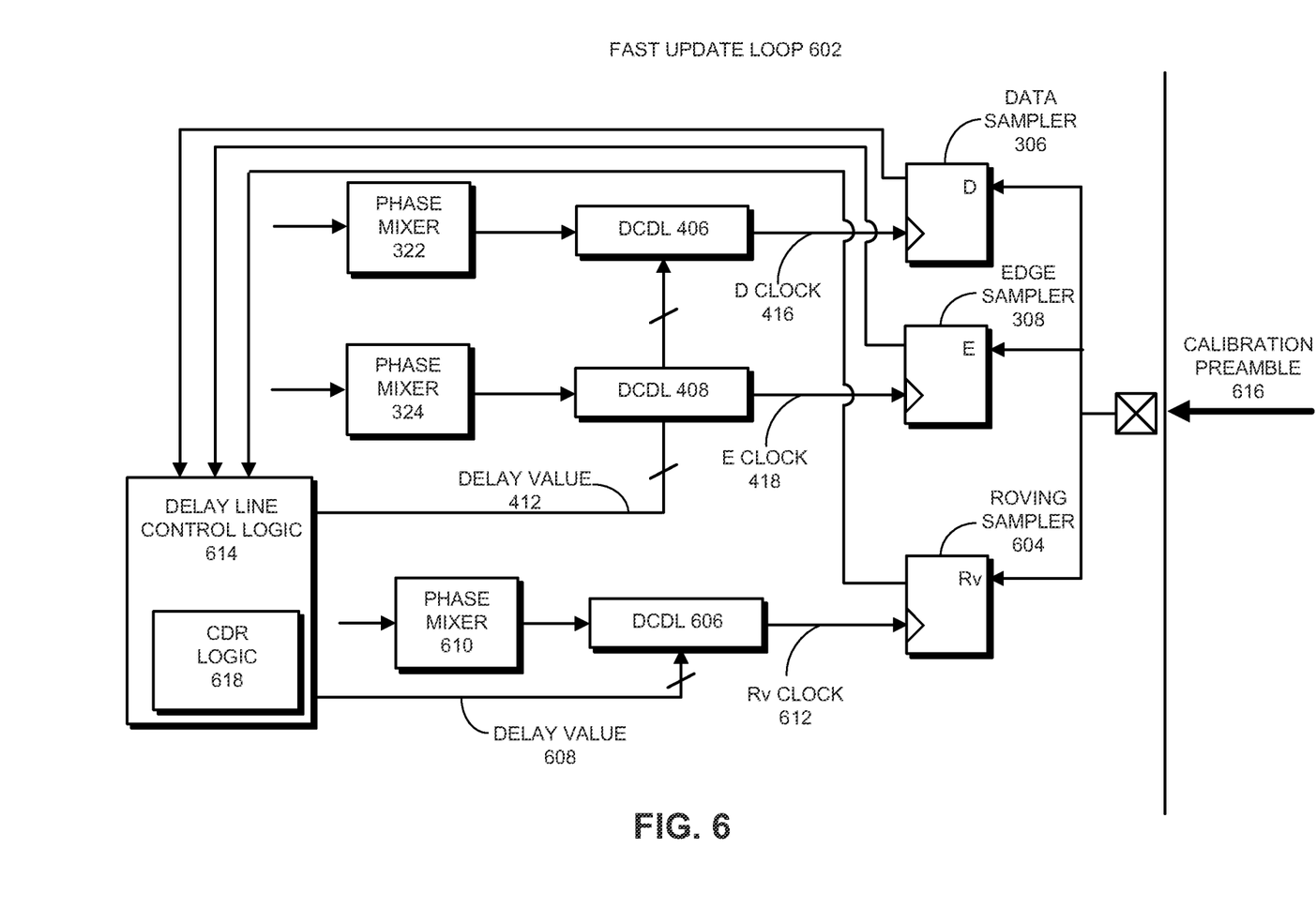
FIG. 6 presents a block diagram illustrating circuitry for performing a binary fast-lock search using three samplers and three DCDLs.

FIG. 6 presents a block diagram illustrating a fast update loop 602 for performing a binary fast-lock search using three samplers and three DCDLs. As illustrated in FIG. 6, fast update loop 602 comprises the same fast update loop in memory controller 402, which includes data sampler 306, edge sampler 308, phase mixer 322, phase mixer 324, and DCDLs 406 and 408. Note that DCDLs 406 and 408 receive delay value 412 and generate D clock 416 and E clock 418 the same way as in memory controller 402.

Fast update loop 602 also includes an additional sampler referred to as the "roving sampler" 604. Roving sampler 604 is coupled to a DCDL 606, which is controlled by a separate digital delay value 608. DCDL 606 also receives a clock signal from an additional phase mixer 610 and subsequently generates an "Rv" clock 612 as the data clock for roving sampler 604. Note that one or more of DCDLs 406, 408, and 606 can be implemented as a binary-weighted DCDL.

In one embodiment, both delay value 412 and delay value 608 are generated by a common delay line control logic 614. As shown in FIG. 6, delay line control logic 614 receives sampled values of calibration preamble 616 from data sampler 306, edge sampler 308, and roving sampler 604, and generates digital delay values 412 and 608 based on the sampled values. In some embodiments, delay line control logic 614 uses CDR logic 618 to extract early-late phase decisions from the sampled inputs from all three data samplers. CDR logic 618 subsequently generates delay values 412 and 608 based on the early-late phase decisions. In one embodiment, CDR logic 618 generates delay values 412 and 608 to enable a binary fast-lock search. A detailed embodiment of this binary fast-lock search is provided below in conjunction with FIG. 7.

Figure 7:
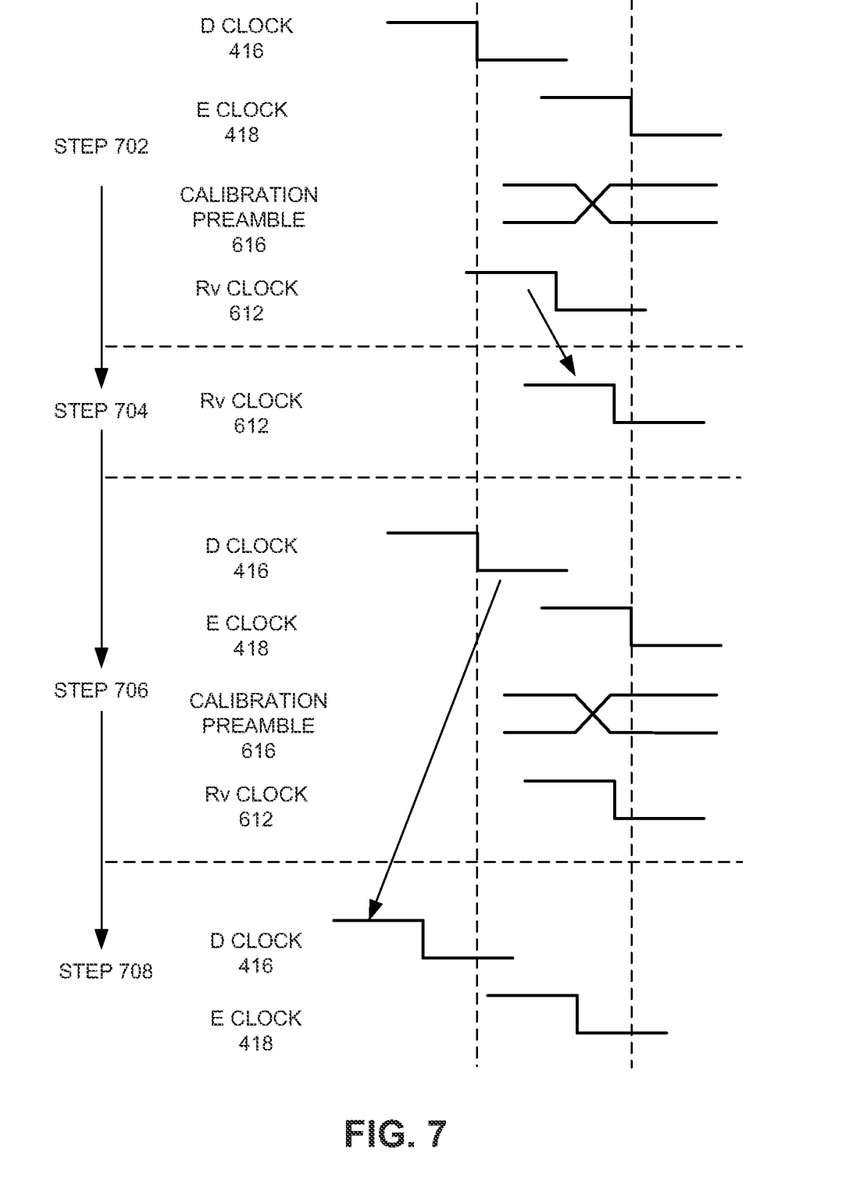
FIG. 7 illustrates an exemplary binary search for acquiring a fast lock for read data during a fast update.

FIG. 7 illustrates an exemplary binary search for acquiring a fast phase lock for read data using fast update loop 602. As illustrated in FIG. 7, the binary search begins at step 702, wherein three samplers, data sampler 306, edge sampler 308, and roving sampler 604 are used to sample calibration preamble 616 based on the corresponding clocks, D clock 416, E clock 418, and Rv clock 612. Note that D clock 416 and E clock 418 are separated by 90 degrees, and Rv clock 612 starts approximately halfway between D clock 416 and E clock 418. The multiple samplings occur within one UI of calibration preamble 616, and generate three samples from calibration preamble 616.

In step 704, CDR logic 618 uses the sampled values from step 702 to determine the phase relationships between the current edge transition in calibration preamble 616 and the sampling clocks. In the particular example case of FIG. 7, CDR logic 618 determines that the current edge transition in calibration preamble 616 occurs in between the Rv clock edge and the E clock edge. Based on this determination, the Rv clock edge occurs before the current edge transition in calibration preamble 616, CDR logic 618 subsequently moves Rv clock 612 one most significant bit (MSB) later (shown as the arrow between step 702 and step 704). In one embodiment, the MSB value is determined based on the corresponding DCDL delay range. For example, if the corresponding DCDL was calibrated to have a delay range of +/−0.6 UI (via center '0' value), the first MSB value is 0.3 UI.

In the example shown in step 706, the three data samplers are used to sample calibration preamble 616 based on D clock 416, E clock 418, and the new position of Rv clock 612. Next, CDR logic 618 uses the newly sampled values from step 706 to determine the phase relationships between the current edge transition in calibration preamble 616 and the sampling clocks. In the case of FIG. 7, CDR logic 618 determines that the edge transition occurs before both Rv clock edge and the E clock edge. Based on this determination, CDR logic 618 next moves D clock 416 and E clock 418 the next smaller binary value earlier (shown as the arrow between step 706 and step 708). For example, if the corresponding DCDL has a delay range of +/−0.6 UI, the next smaller value is 0.15 UI.

Continuing in this binary fashion, CDR logic 618 alternately adjusts the data/edge-sampler delay line settings (e.g., DCDL 406 and DCDL 408) and the roving-sampler delay line setting (e.g., DCDL 606) in increments that decrease by a factor of two to determine a position of a repeating edge transition in calibration preamble 616. After each binary search, the E clock edge is moved closer to the edge transition in calibration preamble 616. This process continues until the end of the calibration preamble is reached.

Note that the accuracy of the binary search is determined by the value of the least significant bit (LSB), which in turn depends on a number of factors. First, the LSB of the binary search depends on the length of the calibration preamble and the total number of clock edges and early/late decisions. Note that a longer calibration preamble leads to more binary search steps and subsequently a smaller value for the LSB. Second, the LSB of the search depends on the total delay range of the DCDLs used in the search, wherein a narrower delay range leads to a finer range for the LSB. Hence, it is desirable to minimize the delay range of a given delay line based in some embodiments on empirical drift measurements to improve the resolution of the adjustment provided by the delay line.

Moreover, the LSB of the binary search depends on the number of decisions which can be generated within a given length of the calibration preamble. For example, for a 16-bit calibration preamble, ideally 16 binary search steps can be made based on 1 UI per decision. However, a 1 UI time may not be sufficient to complete one binary-search step, which involves an entire fast-update-loop cycle. Hence, 2 UI or 4 UI may be necessary to make one decision. For example, a 2 UI decision update-loop with a 16-bit calibration preamble results in 8 decisions overall. For a +/−0.6 UI delay range of the DCDL, this translates into a 0.3 UI MSB and a 0.0023 UI LSB. In comparison, a 4 UI decision with a 16-bit calibration preamble results in only 4 decisions overall. For a 0.6 UI delay range of the DCDL, this translates into a 0.3 UI MSB and a 0.0375 UI LSB.

Also note that some embodiments make one decision based on two or more samples, wherein each sample may be generated based on 1 or multiple UI of calibration preamble. In one embodiment, greater care is taken when making the very first or first few decisions to ensure its correctness. For example, one binary search can average 4 samples to make the first decision. After the first decision, fewer samples are used for subsequent decisions and then no averaging is used as the search gets closer to the end.

Figure 8:
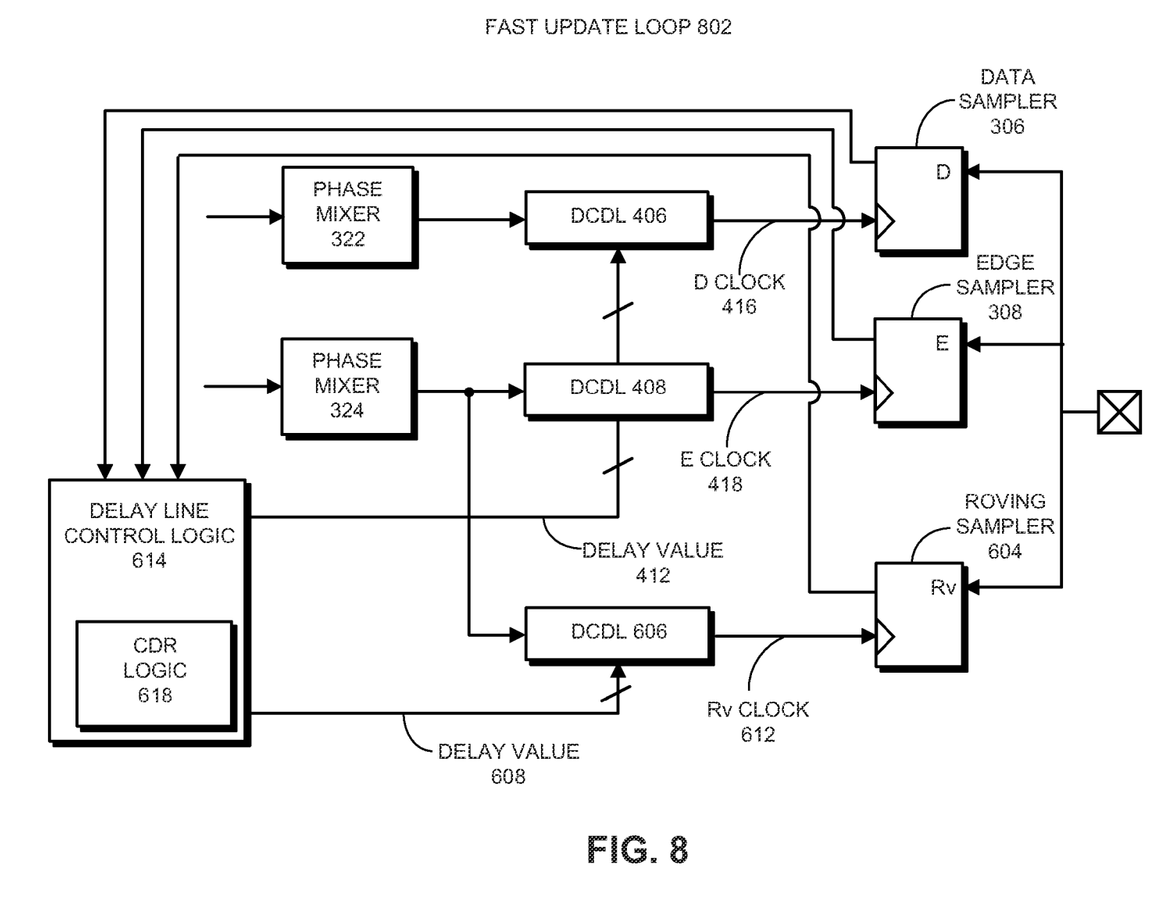
FIG. 8 presents a block diagram illustrating a fast update operation which is a modified version of the fast update operation illustrated in FIG. 6.

FIG. 8 presents a block diagram illustrating a fast update loop 802 which is a modified version of fast update loop 602 illustrated in FIG. 6. In this embodiment, the separate phase mixer in the clock path of roving sampler 604 is eliminated. Instead, DCDL 606 shares the same phase mixer 324 with DCDL 408 for edge sampler 308. This embodiment assumes that there is sufficient delay range on DCDLs 406, 408, and 606 to capture all the variations from the position of E clock 418 to the position of Rv clock 612. In one embodiment, one of DCDL 408 and DCDL 606 is biased high and the other is biased to a low original setting to allow for separation between E clock 418 and Rv clock 612. With proper separation equivalent to ½ the expected maximum error or more, the DCDL's 408 and 606 can accomplish a binary search without the use of phase mixer 610 in FIG. 6.

In alternate embodiments other search methods can be used that are simpler (but slower) or more complex (but faster) than a binary search. In the simplest of these a direct linear search can be used to acquire the drift in phase by means of a large DCDL step size, with the DCDL total range set adjusted to the maximum expected drift. In a parallel search, multiple additional edge samplers and phase mixer/DCDL's can be employed to oversample the incoming preamble generating more phase location information for each bit of preamble at the expense of additional hardware. Those skilled in the art can easily conceive of alternate search approaches beyond these three methods to take advantage of the separation of inherent rank-phase delay information from phase drift information that the combination of the rank tracking circuit and the DCDL provide.

The above-described techniques and apparatus can be used in different systems employing different types of memory devices and memory controllers that control the operation of these memory devices. Examples of these systems include, but are not limited to, mobile systems, desktop computers, servers, and/or graphics applications. The memory devices can include dynamic random access memory (DRAM). Moreover, the DRAM may be, e.g., graphics double data rate (GDDR, GDDR2, GDDR3, GDDR4, GDDR5, and future generations) and double data rate (DDR2, DDR3 and future memory types).

The techniques and apparatus described may be applicable to other types of memory, for example, flash and other types of non-volatile memory and static random access memory (SRAM). Moreover, throughout this description, a clock signal is described; it should be understood that a clock signal in the context of the instant description may be embodied as a strobe signal or, generally, as a signal that conveys timing information, and is not limited to a signal that is strictly periodic. For example, a timing reference may be a clock signal, which is periodic (however, it may be gated), or may be a strobe signal (that is aperiodic in the sense that it indicates when to sample data).

Figure 9:
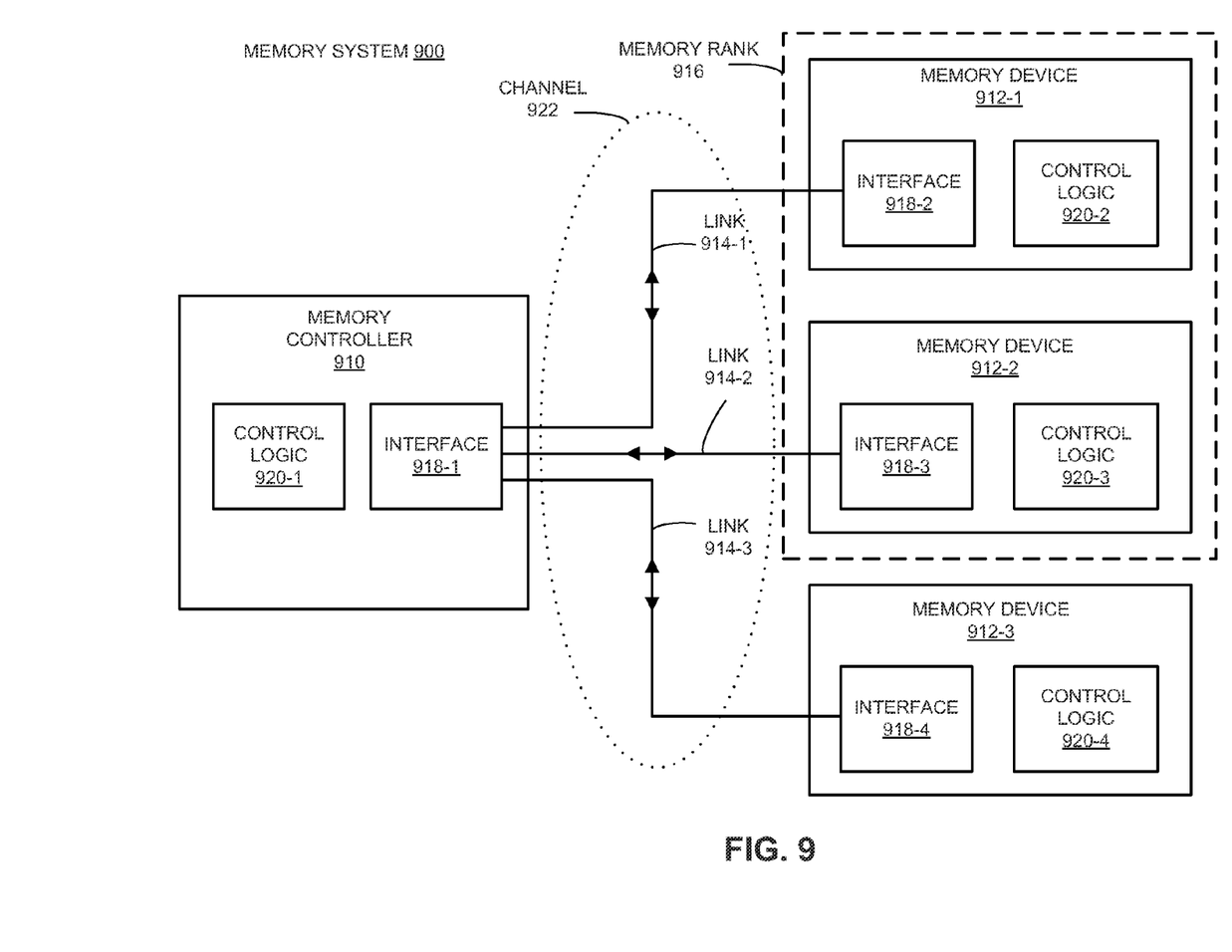
FIG. 9 presents a block diagram illustrating an embodiment of a memory system, which includes at least one memory controller and one or more memory devices.

Additional embodiments of memory systems that may use one or more of the above-described apparatus and techniques are described below with reference to FIG. 9. FIG. 9 presents a block diagram illustrating an embodiment of a memory system 900, which includes at least one memory controller 910 and one or more memory devices 912. Moreover, each of memory devices 912 can include multiple ranks (not shown). While FIG. 9 illustrates memory system 900 with one memory controller 910 and three memory devices 912, other embodiments may have additional memory controllers and fewer or more memory devices 912. Moreover, while memory system 900 illustrates memory controller 910 coupled to multiple memory devices 912, in other embodiments the system may include two or more memory controllers. Note that memory controller 910 and one or more of the memory devices 912 may be implemented on the same or different integrated circuits, and that the one or more integrated circuits may be included in a single chip-package.

In some embodiments, memory controller 910 is a local memory controller (such as a DRAM memory controller) and/or is a system memory controller (which may be implemented in a microprocessor, an application-specific integrated circuit (ASIC), a system-on-a-chip (SoC) or a field-programmable gate array (FPGA)).

Memory controller 910 may include an I/O interface 918-1 and control logic 920-1. In some embodiments, one or more of memory devices 912 include control logic 920 and at least one of interfaces 918. However, in some embodiments some of the memory devices 912 may not have control logic 920. Moreover, memory controller 910 and/or one or more of memory devices 912 may include more than one of the interfaces 918, and these interfaces may share one or more control logic 920 circuits. In some embodiments two or more of the memory devices 912, such as memory devices 912-1 and 912-2, may be configured as a memory rank 916.

As discussed in conjunction with FIGS. 4-8, control logic 920-1 on memory controller 910 may include multiple DCDLs within a fast update loop for performing fast timing reacquisition of read timing during a read operation to support rank switching in a multi-rank memory device. Memory controller 910 can also include a low-bandwidth phase update loop for updating register values in a rank-tracking table to account for the timing drift in the received read data determined by the fast update loop. Moreover, memory controller 910 can be configured to perform binary searches for acquiring a fast lock to the received read data using the fast update loop. Some embodiments of memory controller 910 are also configured to perform the fast timing reacquisition described in conjunction with FIG. 5A.

Memory controller 910 and memory devices 912 are coupled by one or more links 914, such as multiple wires, in a channel 922. While memory system 900 is illustrated as having three links 914, other embodiments may have fewer or more links 914. Moreover, these links may provide: wired, wireless and/or optical communication. Furthermore, links 914 may be used for bi-directional and/or uni-directional communication between the memory controller 910 and one or more of the memory devices 912. For example, bi-directional communication between the memory controller 910 and a given memory device may be simultaneous (full-duplex communication). Alternatively, the memory controller 910 may transmit information (such as a data packet which includes a command) to the given memory device, and the given memory device may subsequently provide the requested data to the memory controller 910, e.g., a communication direction on one or more of the links 914 may alternate (half-duplex communication). Also, one or more of the links 914 and corresponding transmit circuits and/or receive circuits may be dynamically configured, for example, by one of the control logic 920 circuits, for bi-directional and/or uni-directional communication.

Signals corresponding to data and/or commands (such as request-for-data commands) may be communicated on one or more of the links 914 using either or both edges in one or more timing signals. These timing signals may be generated based on one or more clock signals, which may be generated on-chip (for example, using a phase-locked loop and one or more reference signals provided by a frequency reference) and/or off-chip. In some embodiments, operations involved in transmitting and receiving these signals may be synchronous and/or asynchronous.

In some embodiments, commands are communicated from the memory controller 910 to one or more of the memory devices 912 using a separate command link, i.e., using a subset of the links 914 which communicate commands. However, in some embodiments commands are communicated using the same portion of the channel 922 (i.e., the same links 914) as data. Moreover, communication of commands: may have a lower data rate than the data rates associated with communication of data between the memory controller 910 and one or more of the memory devices 912; may use different carrier frequencies than are used to communicate data; and/or may use a different modulation technique than is used to communicate data.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing a fast timing reacquisition in a memory controller, comprising:
    during a read operation,
        receiving, via a signal line, a data signal at the memory controller, wherein the data signal includes a timing reference signal followed by read data; and
        using the timing reference signal included in the data signal to perform the fast timing reacquisition to compensate for a timing drift between a clock path and a data path for the read data;
    wherein performing the fast timing reacquisition comprises adjusting a data delay line coupled to the clock path and associated with a control loop, wherein the control loop controls a clock signal used to receive the data signal at the memory controller.

2. The method of claim 1, wherein the timing reference signal comprises a calibration preamble.

3. The method of claim 1, wherein the control loop comprises one of:
    a phase-locked loop (PLL); and
    a delay-locked loop (DLL).

4. The method of claim 1, wherein performing the fast timing reacquisition comprises performing one of the following operations on a relative phase position to determine the data delay line adjustment:
    a binary search;
    a parallel search; and
    a linear search.

5. The method of claim 4, wherein performing the binary search involves using a roving sampler with an associated roving-sampler delay line in conjunction with an edge sampler and an associated edge-sampler delay line to perform the binary search.

6. The method of claim 5, wherein the binary search involves alternately adjusting the edge-sampler delay line and the roving-sampler delay line in increments that decrease by a factor of two to determine a position of a repeating edge transition in the timing reference signal.

7. The method of claim 5, wherein a given step in the binary search involves:
    aggregating multiple samples from the roving sampler and the edge sampler; and
    using the aggregated samples to make a binary search decision.

8. The method of claim 5, wherein the roving sampler and the edge sampler are coupled through respective delay lines to a shared phase mixer.

9. The method of claim 5, wherein the roving sampler and the edge sampler are coupled through respective delay lines to different phase mixers.

10. The method of claim 1, wherein the data signal including the timing reference signal followed by the read data is received responsive to transmitting a request for read data to a memory rank being accessed after an idle period for the memory rank.

11. A memory controller that facilitates a fast timing reacquisition during a read operation, comprising:
    a control loop which controls a clock signal used to receive a data signal at the memory controller;
    a data delay line coupled to a clock path and associated with the control loop; and
    fast-locking control logic configured to perform the fast timing reacquisition by,
        receiving, via a signal line, the data signal for the read operation, wherein the data signal includes a timing reference signal followed by read data, and
        using the timing reference signal to adjust the data delay line to compensate for a timing drift between the clock path and a data path for the data signal.

12. The memory controller of claim 11, wherein the timing reference signal comprises a calibration preamble.

13. The memory controller of claim 11, wherein the control loop comprises one of:
    a phase-locked loop (PLL); and
    a delay-locked loop (DLL).

14. The memory controller of claim 11, wherein performing the fast timing reacquisition comprises performing one of the following operations on a relative phase position to determine the data delay line adjustment,
- a binary search;
- a parallel search; and
- a linear search.

15. The memory controller of claim 14, wherein the memory controller further comprises:
- a data sampler configured to receive the clock signal through the data delay line;
- an edge sampler configured to receive an edge clock signal through an edge-sampler delay line; and
- a roving sampler configured to receive a roving clock signal through a roving-sampler delay line;
- wherein performing the binary search involves using the data sampler, the edge sampler and the roving sampler to make binary search decisions.

16. The memory controller of claim 15, wherein the binary search involves alternately adjusting the edge-sampler delay line and the roving-sampler delay line in increments that decrease by a factor of two to determine a position of a repeating edge transition in the timing reference signal.

17. The memory controller of claim 15, wherein a given step in the binary search involves:
- aggregating multiple samples from the roving sampler and the edge sampler; and
- using the aggregated samples to make a binary search decision.

18. The memory controller of claim 15, further comprising a shared phase mixer which is coupled to the roving sampler through the roving-sampler delay line, and to the edge sampler through the edge-sampler delay line.

19. The memory controller of claim 15, further comprising:
- an edge-sampler phase mixer coupled to the edge sampler through the edge-sampler delay line; and
- a roving-sampler phase mixer coupled to the roving sampler through the roving-sampler delay line.

20. The memory controller of claim 11, wherein the read operation is a first access to the rank after an idle period for the rank.

21. The memory controller of claim 20, wherein the read operation is a first access to the rank after a fast rank-switching operation from a preceding rank.

22. The memory controller of claim 21, wherein the fast rank-switching operation involves looking up a phase for the rank in a table containing phases for each rank in a memory system associated with the memory controller.

* * * * *